United States Patent [19]

Przyjemski

[11] 4,318,063
[45] Mar. 2, 1982

[54] CRYSTAL OSCILLATOR COMPENSATED FOR G-SENSITIVITY

[75] Inventor: Joseph M. Przyjemski, Carlisle, Mass.

[73] Assignee: The United States of America as represented by the Secretary of the Air Force, Washington, D.C.

[21] Appl. No.: 35,578

[22] Filed: May 3, 1979

[51] Int. Cl.³ .............................................. H03B 5/32
[52] U.S. Cl. .................................. 331/158; 331/116 R
[58] Field of Search ............. 331/158, 116 R, 116 FE, 331/175; 361/278, 280

[56] References Cited

U.S. PATENT DOCUMENTS 4,100,512  7/1978  Valdois ............................... 331/158

Primary Examiner—David K. Moore
Attorney, Agent, or Firm—Donald J. Singer; Willard R. Matthews, Jr.

[57] ABSTRACT

A crystal reference oscillator with improved g-sensitivity is realized through the use of an appropriately oriented single axis accelerometer. Components of acceleration normal to the plane of zero g-sensitivity of the oscillator are sensed by the accelerometer which returns a correction voltage to the electronic frequency control input of the oscillator. A model is developed that permits determination of accelerometer position relative to the oscillator without prior knowledge of crystal orientation.

1 Claim, 5 Drawing Figures

CRYSTAL OSCILLATOR COMPENSATED FOR G-SENSITIVITY

STATEMENT OF GOVERNMENT INTEREST

The invention described herein may be manufactured and used by or for the Government for governmental purposes without the payment of any royalty thereon.

BACKGROUND OF THE INVENTION

This invention relates to oscillators that are subject to acceleration effects such as those utilized in Global Positioning Systems (GPS) tracking receivers. The invention particularly relates to the compensation of acceleration induced frequency variations in such oscillators.

Frequency variations in crystal reference oscillators, resulting from resonator sensitivity to acceleration, limit the tracking performance of GPS navigation receivers aboard tactical aircraft. These variations are increased during frequency conversion to L band and generate phase variations at the input to receiver tracking loops. Consequently, an indication of a dynamic condition exists which can erroneously be interpreted as similar line-of-sight dynamic behavior in the GPS signal. More importantly, the resulting phase error generated in the initial measurement unit (IMU) aided tracking loops can become large enough to cause loss of carrier lock. To reduce this possibility, tracking-loop bandwidths are made wider than normally appropriate for good tacking performance in a jamming environment. A requirement exists, therefore, for a crystal reference oscillator that is less sensitive to acceleration.

State-of-the-art approaches to overcomming the problem of g-sensitivity include:

The use of atomic frequency standards;
The use of different crystal cuts in a crystal oscillator; and,
The use of a dual resonator design in a crystal oscillator.

These methods have in most instances been less than satisfactory. Atomic frequency standards tend to be large and expensive and only the effects of constant acceleration are minimized. There is little improvement in g-sensitivity for the ammonia standard currently under development. However, overall improvement in g-sensitivity takes place at the expense of short term frequency stability. The use of doubly rotated crystal cuts improves g-sensitivity by only factors of 2-5. Furthermore, these cuts are more complicated and therefore require tighter manufacturing tolerances. The dual resonator design is only under development at this time, but initially indicates improvement in g-sensitivity by a factor of 10. However, very careful hand matching of crystals are required for whatever performance is achieved.

There currently exists, therefore, the need for an oscillator suitable for use in GPS tracking receivers and other acceleration effected systems that do not have the deficiencies and limitations of presently available devices. The present invention is directed toward satisfying that need.

SUMMARY OF THE INVENTION

The invention comprehends a method of improving g-sensitivity utilizing the most common crystal cut for the required frequency range. An inexpensive single axis accelerometer is used in conjunction with a simple model of crystal oscillator acceleration sensitivity to provide suitable frequency correction by measuring acceleration and generating the proper correction voltage for the oscillator's existing electronic frequency control. The necessary ingredient for effective compensation lies in the correct orientation of the accelerometer relative to the oscillator. Measurement of acceleration in this direction alone is all that is required to generate the correct voltage to be used for frequency control. A model is developed in which only three measurements are required to establish this direction.

The invention is mechanized by one inexpensive single axis accelerometer, a minimum of circuitry and a commonly available crystal oscillator. The accelerometer is physically oriented to detect components of acceleration normal to the oscillator's plane of zero g-sensitivity. It generates a correction voltage signal which is applied to the electronic frequency control input of the oscillator.

It is a principal object of the invention to provide a new and improved g-sensitivity compensated crystal oscillator.

It is another object of this invention to provide a g-sensitivity compensated crystal oscillator that is relatively small, lightweight and inexpensive.

It is another object of the invention to provide a g-sensitivity compensated crystal oscillator that utilizes a minimum of circuitry and that is readily fabricated from commonly available inexpensive components.

These together with other objects, features and advantages of the invention will become more readily apparent from the following detailed description when taken in conjunction with the illustrative embodiment in the accompanying drawings.

DESCRIPTION OF THE PREFERRED EMBODIMENT

Figure 1:
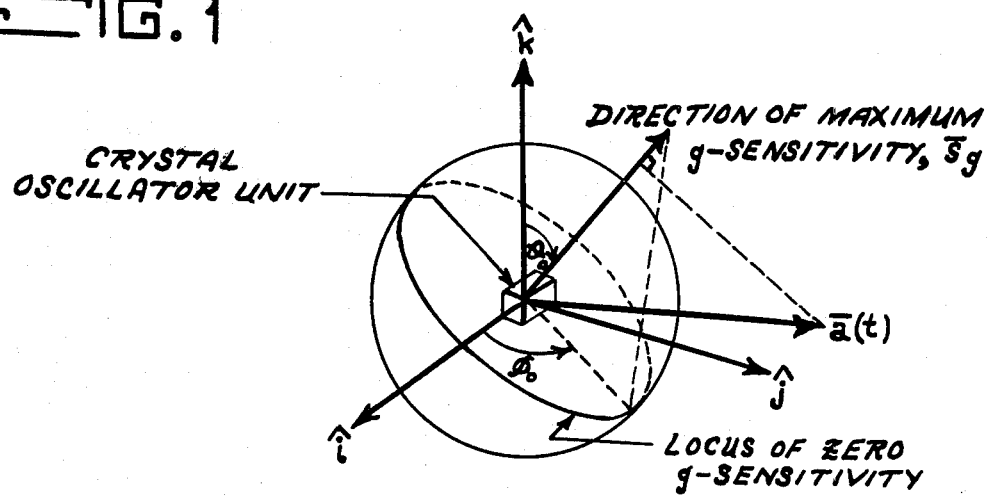
FIG. 1 illustrates a spherical coordinate system having an oscillator fixed at its origin and showing angular dependency of g-sensitivity relative to the oscillator.

The allowable g-sensitivity of a crystal oscillator in a tracking receiver is based on the amount of phase error that can be tolerated in the receiver carrier tracking loop under dynamic conditions. It has been shown that this relationship is bandwidth dependent as based on results which assume that worst case aircraft dynamics are modeled as a step in jerk of 10 g/second lasting 0.6 second. Published curves show that a decrease in g-sensitivity by two orders of magnitude is required to achieve maximum phase error of 0.1 radian in a 1.0-Hz noise bandwidth.

Loop response to oscillator vibration constitutes the system frequency response and, as such, becomes a convenient base for analysis since it lends insight to the problem of low-frequency modulation of the unit's center frequency. Published response curves based on vibration amplitude of 1.0 g and g-sensitivity of $1 \times 10^{-9}/g$, illustrate the dependence of tracking error on vibration frequency and noise bandwidth. For each value of single sided noise bandwidth $B_L$, peak phase error occurs at the angular vibration frequency approximately equal to the loop natural frequency, $\omega_n$. Below this value, phase error decreases because the loop can track the more slowly changing frequency vibrations. Above the loop natural frequency, phase error decreases as a result of a decreasing phase variation at the tracking-loop input. This quantity is related to frequency variation and vibration frequency by $$\Delta\phi = \Delta f / f_v \tag{1}$$

where
$\Delta\phi$ = magnitude of phase variation (radians)
$\Delta f$ = magnitude of frequency variation (Hz)
$f_v$ = vibration frequency (Hz)

Equation (1) shows that less compensation for g-sensitivity is required for the higher frequency of the acceleration profile.

The foregoing analysis is based on the assumption that the frequency offset is linearly related to acceleration magnitude and independent of its frequency content. Experimental results empirically show the validity of this assumption as well as provide detailed information regarding the dependence of g-sensitivity on the direction of acceleration relative to the crystal oscillator. The experimental procedures involved the measurement of frequency or phase changes in the nominal output of an HP-10544A oscillator as a function of vibration amplitude, frequency, and direction. Electronic circuitry and mechanical fixtures were designed to facilitate the measurement of these variables while varying the orientation of the crystal oscillator relative to a shaker's axis of vibration. Curves have been developed showing the sinusoidal variation in frequency offset during vibration at 10 Hz. The g-sensitivity in this direction is calculated by $$S_g(\theta,\phi) = (\Delta f_p/f_o)/a = 1.04 \times 10^{-9} g \tag{2}$$

where
$S_g(\theta,\phi)$ = g-sensitivity ($g^{-1}$) of crystal oscillator in the direction, $(\theta,\phi)$
$\Delta f_p$ = peak value of frequency offset (Hz)
$f_o$ = nominal oscillator frequency (Hz)
$a$ = vibration amplitude (g)

As shown in FIG. 1, $\theta$ and $\phi$ are angular coordinates describing the direction of acceleration in a spherical coordinate system having the oscillator fixed at its origin.

It has been demonstrated that there is linear dependence of frequency offset on vibration amplitude along three directions.

The independence of frequency offset and vibration frequency has also been established. In making this determination rms phase variations were measured and related to frequency variations by Eq. (1). A curve developed in the process exhibited a $1/f_v$ dependence, indicating a constant $\Delta f$, as vibration frequency is varied from 10 to 100 Hz with constant amplitude. Because this range of vibration frequencies applies essentially quasi-static body forces which perturb the crystal resonant frequency only slightly and slowly within its bandwidth, $\Delta f$ and $f_v$ are independent in the oscillator under consideration.

The measured spatial distribution of g-sensitivity has been plotted and is published in the periodical article entitled A COMPENSATION TECHNIQUE FOR ACCELERATION-INDUCED FREQUENCY CHANGES IN CRYSTAL OSCILLATORS by Joseph M. Przyjemski in IEEE 1978 National Aerospace and Electronic Conference Proceedings May 1978. The indicated values exist on a hemisphere which is viewed by looking down the positive k axis ($0 \leq \phi \leq 90°$). Values of g-sensitivity diametrically opposed ($90° \leq \phi \leq 180°$) have the same magnitude but are of opposite sign, that is, $\Delta f$ changes in the opposite direction. Also shown in the published article is a locus of points defining a plane in which there is no measurable g-sensitivity.

Figure 2:
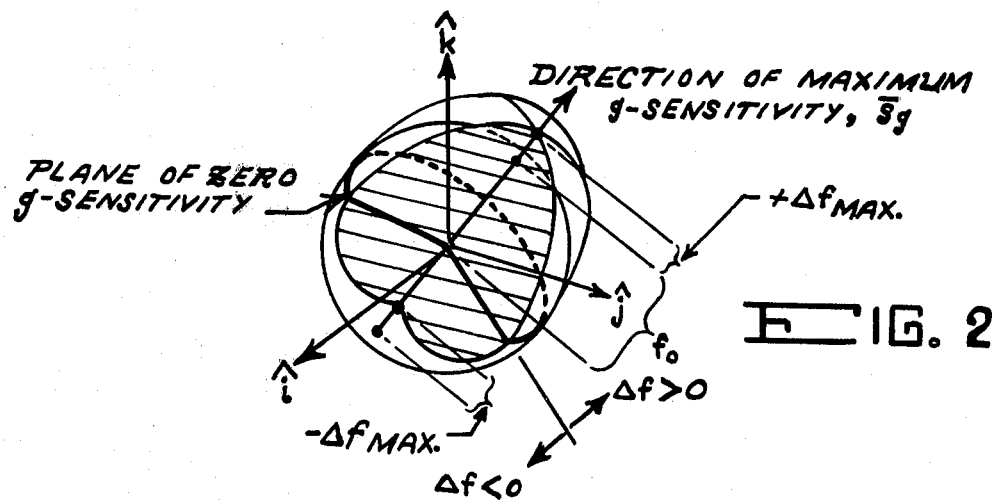
FIG. 2 illustrates a physical model of the spatial distribution of g-sensitivity.
Figure 3:
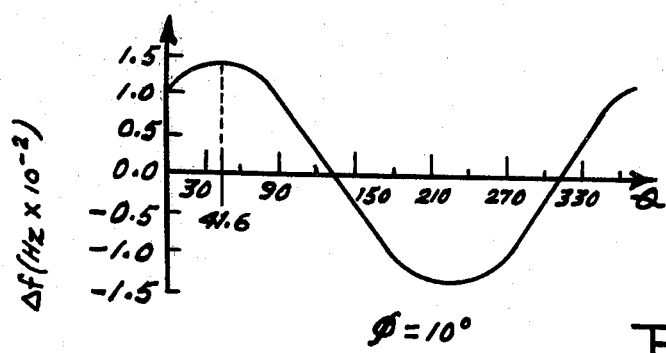
FIG. 3 is a graph showing variation in frequency as a function of oscillator orientation.
Figure 4:
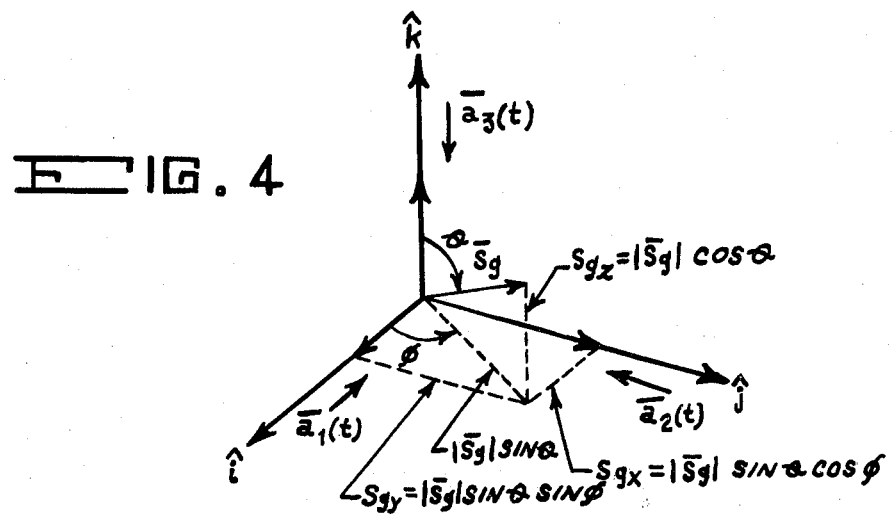
FIG. 4 is a vector diagram of a (t) for determination of the vector quantity Sg.

Based on the data of the above identified published article, a visual description of g-sensitivity behavior is shown in FIG. 2. Here, variation in the distance from the origin to a point on the surface of the figure represents the oscillator frequency variation ($\Delta f$) about its nominal value ($f_o$). This change is proportional to g-sensitivity in the direction of a line drawn from the origin through that point. Positive and negative values of $\Delta f$ are shown above and below the plane of zero g-sensitivity, respectively. Accelerations normal to this plane produce the greatest frequency offset. The g-sensitivity in this direction is of particular significance to the modeling issue and is subsequently referred to as $\overline{S}g(\theta_o,\phi_o)$, a vector quantity, where $\theta_o$ and $\phi_o$ describe its positive direction. From any point in the plane of zero g-sensitivity and passing through ($\theta_o$, $\phi_o$), a plot of $\Delta f$ as a function of $\theta$ rises to a maximum positive value, passes through zero to a maximum negative value before returning to zero. FIG. 3 shows that this behavior is very closely sinusoidal in $\theta$. Assuming an analytical model based on this characteristic, it is possible to generate a simple form of compensation by measuring only acceleration in the direction of $\overline{S}g(\theta_o,\phi_o)$. Accelerations normal to this direction (or in the plane of zero g-sensitivity) produce no frequency offset. Because of indicated sinusoidal behavior of $\Delta f$ versus $\theta$, the magnitude and direction of $\overline{S}g(\theta_o,\phi_o)$ can be determined without prior knowledge of crystal orientation. This is accomplished, as shown in FIG. 4, by making measurements of the peak frequency change, $\Delta f_i$, while the crystal oscillator is undergoing vibration in three mutually orthogonal directions. The three values of g-sensitivity thus determined are the components of $\overline{S}g(\theta_o,\phi_o)$ where $\theta_o$ and $\phi_o$ are measured relative to the frame of reference defined by the chosen set of directions. The magnitude and direction of $\overline{S}g(\theta_o,\phi_o)$ is then calculated by $$|\overline{S}g(\theta_o, \phi_o)| = S_{gx}^2 + S_{gy}^2 + S_{gz}^2 \tag{3}$$

where $$\theta_o = \cos^{-1} \frac{S_{gz}}{|\overline{S}g(\theta_o, \phi_o)|}$$

$$\phi_o = \cos^{-1} \frac{S_{gx}}{|\overline{S}g(\theta_o, \phi_o)| \sin \theta_o}$$

$S_{gx}, S_{gy}, S_{gz} = i, j, k$ components of $\overline{S}g(\theta_o, \phi_o)$ Once $\overline{S}g(\theta_o,\phi_o)$ is known, the fractional frequency offset resulting from the application of acceleration in an arbitrary direction becomes $$\Delta f/f_o = \bar{S}g(\theta_o, \phi_o) \cdot a(t) \quad (4)$$

where
 a(t) = acceleration vector (g)

Figure 5:
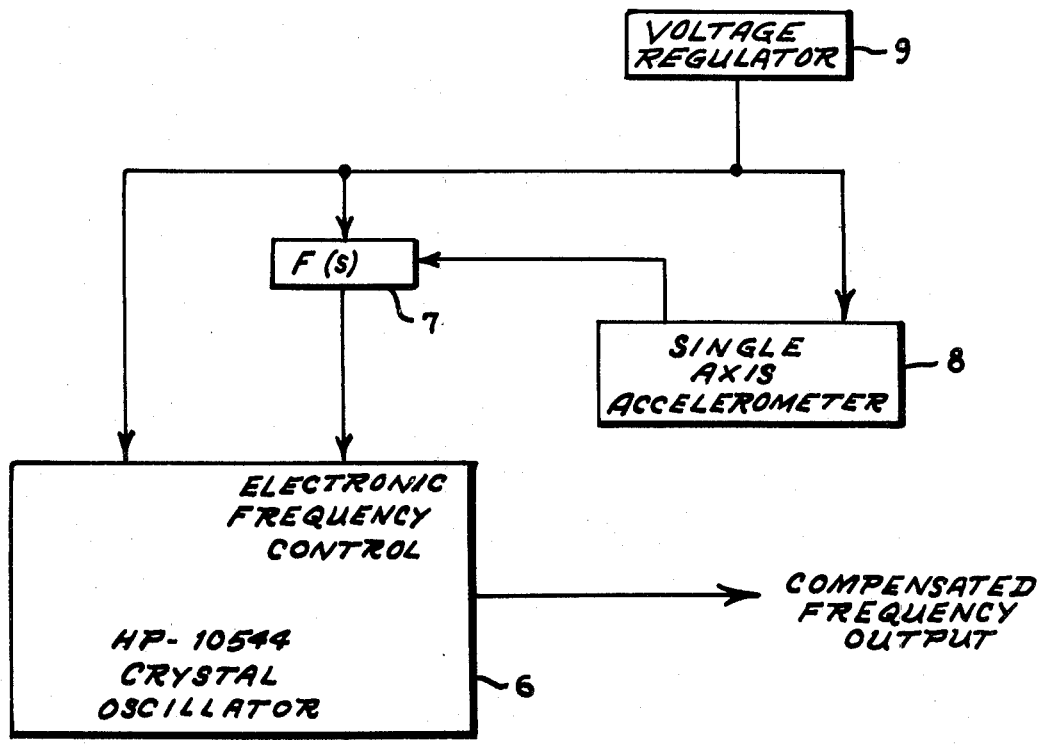
FIG. 5 is a block diagram of the compensated oscillator of the invention.

A block diagram of the compensated crystal oscillator is shown in FIG. 5. It comprises crystal oscillator 6 having an electronic frequency control, low pass filter 7, single axis accelerator 8 and voltage regulator 9 in the circuit arrangement shown. Components of acceleration normal to the plane of zero g-sensitivity of the oscillator are sensed by the accelerometer which returns a correction voltage to the electronic frequency control input of the oscillator. The positioning of the accelerometer in the direction of $\bar{S}g(\theta_o,\phi_o)$ performs the scalar operation required by Eq. (4). Low pass filter F(s) is a filter whose frequency response provides adequate compensation for acceleration in the frequency range from dc to 150 Hz and for amplitudes to 5 g. This range encompasses that portion of aircraft acceleration profiles that adversely affect tracking performance.

While the invention has been described in one presently preferred embodiment it is understood that the words which have been used are words of description rather than words of limitation and that changes within the purview of the appended claims may be made without departing from the scope and spirit of the invention in its broader aspects.

What is claimed is:

1. The method of fabricating a g-sensitivity compensated crystal oscillator comprising the steps of
    providing a crystal oscillator having electronic frequency control,
    determining the plane of zero g-sensitivity of said crystal oscillator,
    providing a single axis accelerometer having an output means
    affixing said accelerometer to said crystal oscillator in a physical orientation relative thereto that is effective to detect components of acceleration normal to said plane of zero g-sensitivity and whereby said accelerometer will generate frequency correction voltage output signals in response to said components of acceleration, and
    connecting said accelerometer output to said electronic frequency control.

* * * * *